United States Patent
Yang et al.

(10) Patent No.: US 11,626,648 B2
(45) Date of Patent: Apr. 11, 2023

(54) BATTERY MODULE INCLUDING BUS BAR PLATE

(71) Applicant: LG CHEM, LTD., Seoul (KR)

(72) Inventors: Seung-Min Yang, Daejeon (KR); Hak-In Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 101 days.

(21) Appl. No.: 16/758,593

(22) PCT Filed: Aug. 8, 2019

(86) PCT No.: PCT/KR2019/010012
§ 371 (c)(1),
(2) Date: Apr. 23, 2020

(87) PCT Pub. No.: WO2020/040460
PCT Pub. Date: Feb. 27, 2020

(65) Prior Publication Data
US 2021/0194097 A1 Jun. 24, 2021

(30) Foreign Application Priority Data
Aug. 21, 2018 (KR) .................. 10-2018-0097586

(51) Int. Cl.
*H01M 50/503* (2021.01)
*H01M 50/569* (2021.01)
(Continued)

(52) U.S. Cl.
CPC ....... *H01M 50/503* (2021.01); *H01M 10/425* (2013.01); *H01M 10/48* (2013.01);
(Continued)

(58) Field of Classification Search
CPC ............. H01M 50/503; H01M 50/284; H01M 50/569; H01M 50/213; H01M 10/425;
(Continued)

(56) References Cited

U.S. PATENT DOCUMENTS

| 2003/0034169 A1* | 2/2003 | Tanaka ................. H05K 3/3426 174/59 |
| 2006/0214631 A1 | 9/2006 | Yoon et al. |

(Continued)

FOREIGN PATENT DOCUMENTS

| JP | 3331412 B2 | 10/2002 |
| JP | 2005-317460 A | 11/2005 |

(Continued)

OTHER PUBLICATIONS

Extended European Search Report for European Application No. 19851077.8, dated Jan. 21, 2021.

(Continued)

*Primary Examiner* — Maria Laios
*Assistant Examiner* — Adam J Francis
(74) *Attorney, Agent, or Firm* — Birch, Stewart, Kolasch & Birch, LLP

(57) ABSTRACT

Disclosed is a battery module capable of reducing manufacturing costs and improving manufacturing efficiency. The battery module includes a cell assembly having a plurality of secondary batteries; a battery management unit having a printed circuit board with a printed circuit, the printed circuit board having a connecting portion on inner and outer peripheries of which a connecting conductor is coated to be electrically connected to the printed circuit; and a bus bar plate having a plate shape, the bus bar plate having a connection portion configured to electrically connect the plurality of secondary batteries and a sensing portion with a strip form elongated from one side end of the connection (Continued)

portion, the sensing portion having a bent structure where a longitudinal end thereof is bent at least two times, at least a part of the bent structure being in elastic contact with an inside of the connecting portion.

15 Claims, 10 Drawing Sheets

(51) Int. Cl.
  *H01M 50/213* (2021.01)
  *H01M 50/284* (2021.01)
  *H01M 10/42* (2006.01)
  *H01M 10/48* (2006.01)

(52) U.S. Cl.
  CPC ....... *H01M 50/213* (2021.01); *H01M 50/284* (2021.01); *H01M 50/569* (2021.01); *H01M 2010/4271* (2013.01)

(58) Field of Classification Search
  CPC ................. H01M 10/48; H01M 10/42; H01M 2010/4271
  See application file for complete search history.

(56) References Cited

U.S. PATENT DOCUMENTS

| | | | | |
|---|---|---|---|---|
| 2007/0105456 | A1* | 5/2007 | Hashimoto | H05K 3/308 439/751 |
| 2008/0226974 | A1* | 9/2008 | Jang | H01M 50/555 429/121 |
| 2011/0076521 | A1 | 3/2011 | Shimizu et al. | |
| 2011/0262777 | A1* | 10/2011 | Choi | H01M 50/502 429/7 |
| 2012/0058675 | A1* | 3/2012 | Hofer | H01R 43/16 439/620.21 |
| 2014/0004392 | A1 | 1/2014 | Sung et al. | |
| 2017/0187011 | A1* | 6/2017 | Cho | H01M 10/425 |
| 2017/0264107 | A1* | 9/2017 | Cheon | H02J 7/0068 |
| 2018/0138483 | A1 | 5/2018 | Sekine | |
| 2019/0123393 | A1 | 4/2019 | Cheon | |
| 2019/0267601 | A1 | 8/2019 | Cho | |

FOREIGN PATENT DOCUMENTS

| | | |
|---|---|---|
| JP | 2014-127418 A | 7/2014 |
| JP | 2015-60844 A | 3/2015 |
| JP | 2017-147179 A | 8/2017 |
| JP | 10-1805546 B1 | 12/2017 |
| KR | 10-0816183 B1 | 3/2008 |
| KR | 10-1198869 B1 | 11/2012 |
| KR | 10-1245296 B1 | 3/2013 |
| KR | 10-1289579 B1 | 7/2013 |
| KR | 10-2016-0058492 A | 5/2016 |
| KR | 10-2017-0077531 A | 7/2017 |
| KR | 10-1797687 B1 | 11/2017 |
| KR | 10-2018-0010591 A | 1/2018 |

OTHER PUBLICATIONS

International Search Report (PCT/ISA/210) issued in PCT/KR2019/010012, dated Nov. 26, 2019.

* cited by examiner

BATTERY MODULE INCLUDING BUS BAR PLATE

TECHNICAL FIELD

The present disclosure relates to a battery module including a bus bar plate, and more particularly, to a method of manufacturing a battery module to reduce manufacturing costs and improve manufacturing efficiency.

The present application claims priority to Korean Patent Application No. 10-2018-0097586 filed on Aug. 21, 2018 in the Republic of Korea, the disclosures of which are incorporated herein by reference.

BACKGROUND ART

In recent years, the demand for portable electronic products such as notebooks, video cameras, mobile phones, or the like is rapidly increasing, and the development of electric vehicles, energy storage batteries, robots, satellites, or the like is in earnest. For this reason, high-performance secondary batteries enabling repeated charging and discharging are being actively researched.

Secondary batteries currently commercialized include nickel cadmium batteries, nickel hydrogen batteries, nickel zinc batteries, lithium secondary batteries and so on. Among them, the lithium secondary batteries are more highlighted in comparison to nickel-based secondary batteries due to advantages such as free charging and discharging, caused by substantially no memory effect, very low self-discharge rate, and high energy density.

The lithium secondary battery mainly uses lithium-based oxides and carbonaceous materials as a positive electrode active material and a negative electrode active material, respectively. In addition, the lithium secondary battery includes an electrode assembly in which a positive electrode plate coated with the positive electrode active material and a negative electrode plate coated with the negative electrode active material are disposed with a separator being interposed therebetween, and an exterior hermetically containing the electrode assembly together with an electrolyte.

In using the secondary battery, it is very important to check the temperature, current and voltage of the secondary battery in terms of preventing the occurrence of safety accidents and improving the secondary battery life.

In other words, as the performance of electronic devices improves day by day, the performance of secondary batteries for supplying a high output power at one time is also improving. In particular, since the secondary batteries used in the high-power electronic devices generate a large amount of heat, an accident such as ignition or explosion may be caused if the temperature rise is not properly handled.

To this end, a battery management unit applied to the electronic device may include a negative temperature coefficient (NTC) device, a positive temperature coefficient device (PTC) element, or the like as a temperature element used for measuring the temperature of a plurality of secondary batteries.

In addition, the conventional battery module includes an electrically conductive bus bar plate for electrically connecting the plurality of secondary batteries in series or in parallel. Further, generally, the bus bar plate is electrically connected to the battery management unit to control charging and discharging of the plurality of secondary batteries or to transfer the power of the plurality of secondary batteries to an external electronic device through an external input/output terminal.

At this time, the bus bar plate may have a sensing portion formed to transfer the power of the plurality of secondary batteries to a connecting portion formed at a printed circuit board so that the bus bar plate is electrically connected to the printed circuit. In order to electrically connect the sensing portion to the connecting portion of the printed circuit board, a soldering process is necessary.

However, the soldering process is difficult, and it takes a lot of time and cost to solder the plurality of bus bar plates to the printed circuit board individually. Accordingly, the manufacturing costs of the battery module are inevitably increased.

DISCLOSURE

Technical Problem

The present disclosure is designed to solve the problems of the related art, and therefore the present disclosure is directed to providing a battery module, which may reduce manufacturing costs and improve manufacturing efficiency.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery module, comprising:

a cell assembly having a plurality of secondary batteries;

a battery management unit having a printed circuit board with a printed circuit, the printed circuit board having a connecting portion on inner and outer peripheries of which a connecting conductor is coated to be electrically connected to the printed circuit; and a bus bar plate having a plate shape, the bus bar plate having a connection portion configured to electrically connect the plurality of secondary batteries and a sensing portion with a strip form elongated from one side end of the connection portion, the sensing portion having a bent structure where a longitudinal end thereof is bent at least two times, at least a part of the bent structure being in elastic contact with an inside of the connecting portion.

Also, the connecting portion may have a connecting groove formed so that a part of the printed circuit board is dented inward.

Moreover, the connecting groove may have a tapered structure so that an inner width of the connecting groove gradually decreases upward from a lower end thereof.

In addition, at least a part of the bent structure of the sensing portion may be inserted and connected upward from the lower end of the connecting portion.

Further, a hanging rod extending in a horizontal direction may be formed at the connecting groove so that at least a part of the bent structure of the sensing portion is hung thereon.

Also, the connecting portion may have a connecting hole formed so that a part of the printed circuit board is perforated.

Moreover, a support wall protruding outward may be formed at the printed circuit board to support an extended longitudinal terminal of the sensing portion.

In addition, an elastic member may be provided to an inner side of the bent structure of the sensing portion to support the bent structure of the sensing portion outward.

Also, the battery module may further comprise a module housing having an inner space formed therein to accommodate the cell assembly.

Moreover, an insert groove dented inward may be formed at an outer surface of the module housing so that a part of the sensing portion extending from the connection portion is inserted and fixed therein.

In addition, the printed circuit board may be mounted on the module housing.

Further, the sensing portion may include:

a fixed part inserted into an insert groove formed at the outer surface of the module housing;

an upright part bent upward from an extended longitudinal end of the fixed part to protrude outward; and a connecting part connected to an extended longitudinal end of the upright part and having a bent structure that is bent at least two time in an inner direction, or in an outer direction, or in an inner direction and an outer direction, the bent structure having a top portion that is in pressure contact with the connecting portion.

Moreover, a support rib protruding upward may be formed at the module housing to support the upright part outward.

Also, in another aspect of the present disclosure, there is also provided a battery pack, comprising at least one battery module according to the present disclosure.

Further, in another aspect of the present disclosure, there is also provided an electronic device, comprising the battery pack according to the present disclosure.

Advantageous Effects

According to an embodiment of the present disclosure, since the battery module of the present disclosure is configured such that at least a part of the bent structure of the sensing portion is located in contact with the inside of the connecting portion, the part of the sensing portion may keep elastically connected to the connecting conductor coated on the connecting portion by using the elastic force of the bent structure of the sensing portion. Accordingly, in the present disclosure, unlike the prior art, the process of soldering the sensing portion of the bus bar plate to the connecting portion of the printed circuit board may be excluded, thereby reducing the manufacturing time and the manufacturing costs.

In addition, according to another embodiment of the present disclosure, since a tapered structure is formed at a lower portion of the inner surface of the connecting groove, the bent structure of the sensing portion may have a wider contact surface with the coated connecting conductor of the connecting groove. In addition, since at least a part of the bent structure of the sensing portion is inserted and connected into the tapered structure in the upper direction, the shape of the sensing portion in close contact with the bent structure in a larger area may be properly maintained.

Further, according to another embodiment of the present disclosure, since a support wall protrusively extending outward is formed on the upper or lower surface of the printed circuit board, a longitudinal terminal of the extended sensing portion may be supported in the vertical and horizontal directions. Accordingly, the sensing portion may be prevented from moving due to an external impact, thereby stably maintaining the connecting state between the sensing portion and the connecting portion.

In addition, according to another embodiment of the present disclosure, since a hanging rod extending in the horizontal direction is formed in the connecting groove so that at least a part of the bent structure of the sensing portion is hung thereon, it is possible to stably maintain the connecting state between the bent structure of the sensing portion and the connecting conductor formed at the connecting groove.

Also, according to an embodiment of the present disclosure, since an elastic member configured to support the bent structure of the sensing portion in the outer direction is provided to an inner side of the bent structure of the sensing portion, it is possible to prevent in advance that the bent structure of the sensing portion is deformed to release the connection with the connecting conductor of the connecting portion. Accordingly, the durability of the battery module may be further improved.

Moreover, according to another embodiment of the present disclosure, in the present disclosure, since a support rib protruding in the upper direction is provided at the module housing to support the upright part of the sensing portion in the outward direction, it is possible to prevent that the upright part of the sensing portion is deformed due to an external impact, and also the upright part may stably maintain its form of extending the upper direction, thereby stably maintaining the connecting state between the connecting portion and the sensing portion of the printed circuit board.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
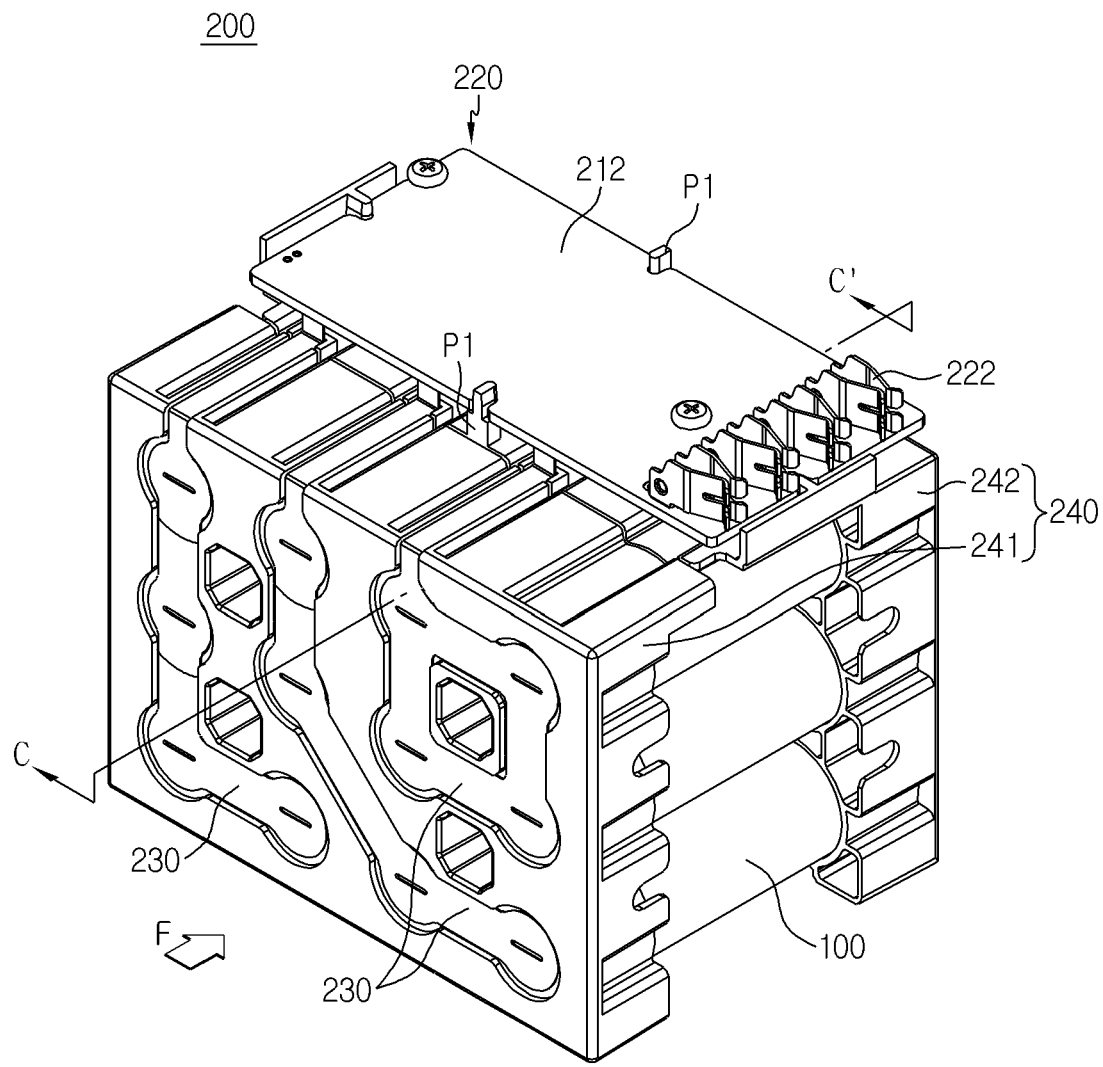
FIG. 1 is a perspective view schematically showing components of a battery module according to an embodiment of the present disclosure.

FIG. 1 is a perspective view schematically showing components of a battery module according to an embodiment of the present disclosure. Also, FIG. 2 is an exploded perspective view schematically showing exploded components of the battery module according to an embodiment of the present disclosure.

Figure 2:
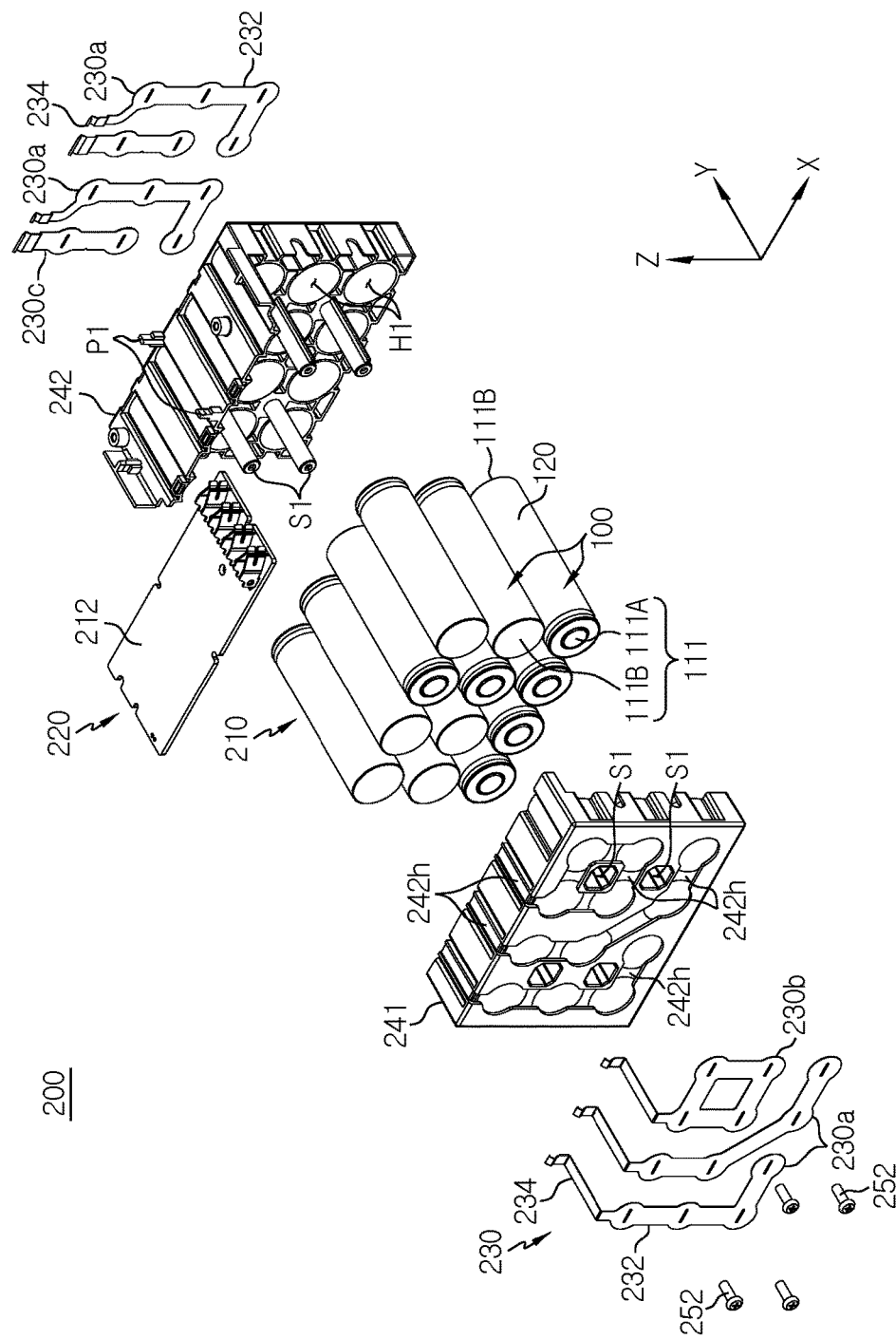
FIG. 2 is an exploded perspective view schematically showing exploded components of the battery module according to an embodiment of the present disclosure.

Referring to FIGS. 1 and 2, a battery module 200 of the present disclosure may include a cell assembly 210, a battery management unit 220, and a bus bar plate 230.

Here, the cell assembly 210 may include a plurality of secondary batteries 100. Specifically, the secondary battery 100 may be a cylindrical battery cell. Hereinafter, the secondary battery will be collectively referred to as a 'cylindrical battery cell'. In addition, the cylindrical battery cell 100 may include a cylindrical battery can 120 and an electrode assembly (not shown) accommodated in the battery can 120.

Here, the battery can 120 may include a material with high electrical conductivity. For example, the battery can 120 may include aluminum, steel, or copper. In addition, electrode terminals 111A, 111B may be formed at both horizontal ends of the battery can 120, respectively.

Specifically, the electrode terminals 111 may include a first electrode terminal 111A and a second electrode terminal 111B having different electrical polarities from each other. In addition, when viewed in the F direction (shown in FIG. 1), the first electrode terminal 111A may be formed at one horizontal end (a front end) of the battery can 120, and the second electrode terminal 111B may be formed at the other horizontal end (a rear end) thereof.

Here, the terms indicating directions such as front, rear, left, right, upper and lower may vary depending on the position of an observer or the shape of an object. However, in this specification, for convenience of description, the front, rear, left, right, upper and lower directions are distinguished based on the case where viewed in the F direction.

Further, the electrode assembly may be formed in a jelly-roll-type structure in a state where a separator is interposed between a positive electrode and a negative electrode. In addition, a positive electrode tab (not shown) may be attached to the positive electrode (not shown) and connected to the first electrode terminal 111A at the front end of the battery can 120. Further, a negative electrode tab (not shown) may be attached to the negative electrode (not shown) and connected to the second electrode terminal 111B at the rear end of the battery can 120.

For example, as shown in FIG. 2, the battery module 200 may include twelve cylindrical battery cells 100 arranged in one direction. In addition, the first electrode terminals 111A of the twelve cylindrical battery cells 100 may be disposed to be adjacent to the second electrode terminals 111B whose polarity is different from that of the first electrode terminals 111A.

However, the secondary battery 100 according to the present disclosure is not limited to the cylindrical battery cell 100 described above, and various kinds of secondary batteries known at the time of filing of this application may be employed.

Figure 3:
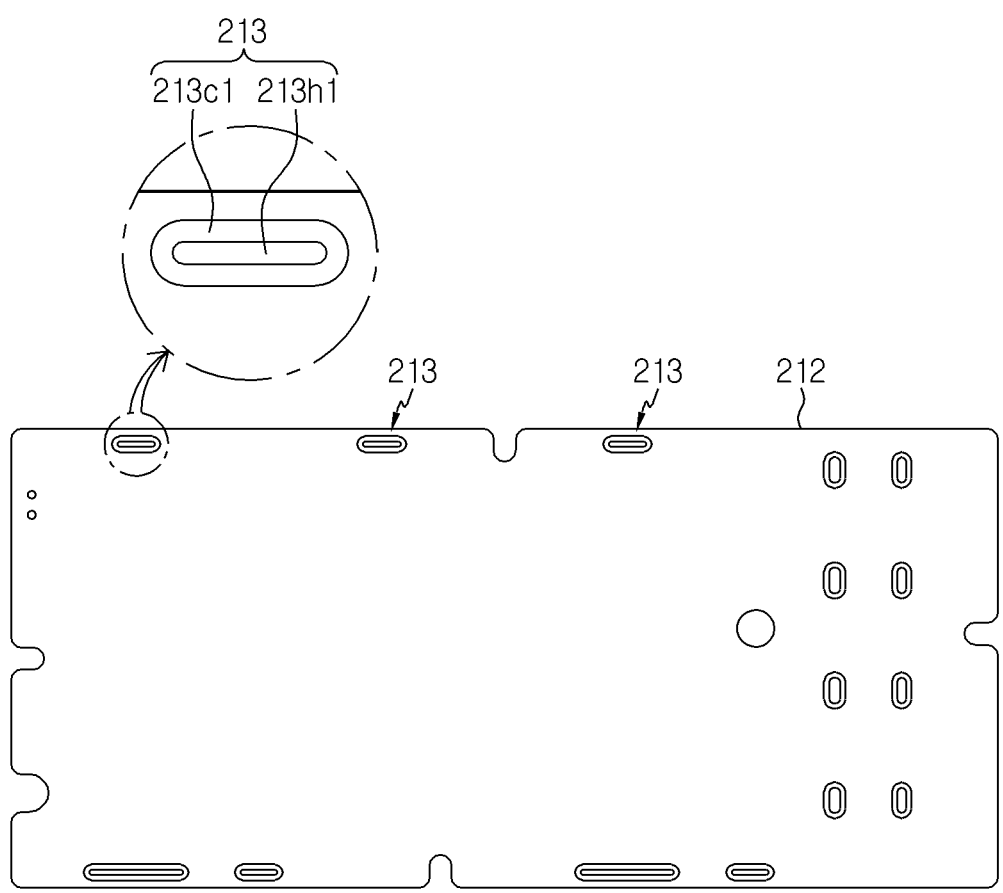
FIG. 3 is a bottom view schematically showing a lower surface of a printed circuit board, employed at the battery module according to an embodiment of the present disclosure.

FIG. 3 is a bottom view schematically showing a lower surface of a printed circuit board, employed at the battery module according to an embodiment of the present disclosure. Also, FIG. 4 is a partial sectioned view schematically showing the battery module, taken along the line C-C' of FIG. 3.

Figure 4:
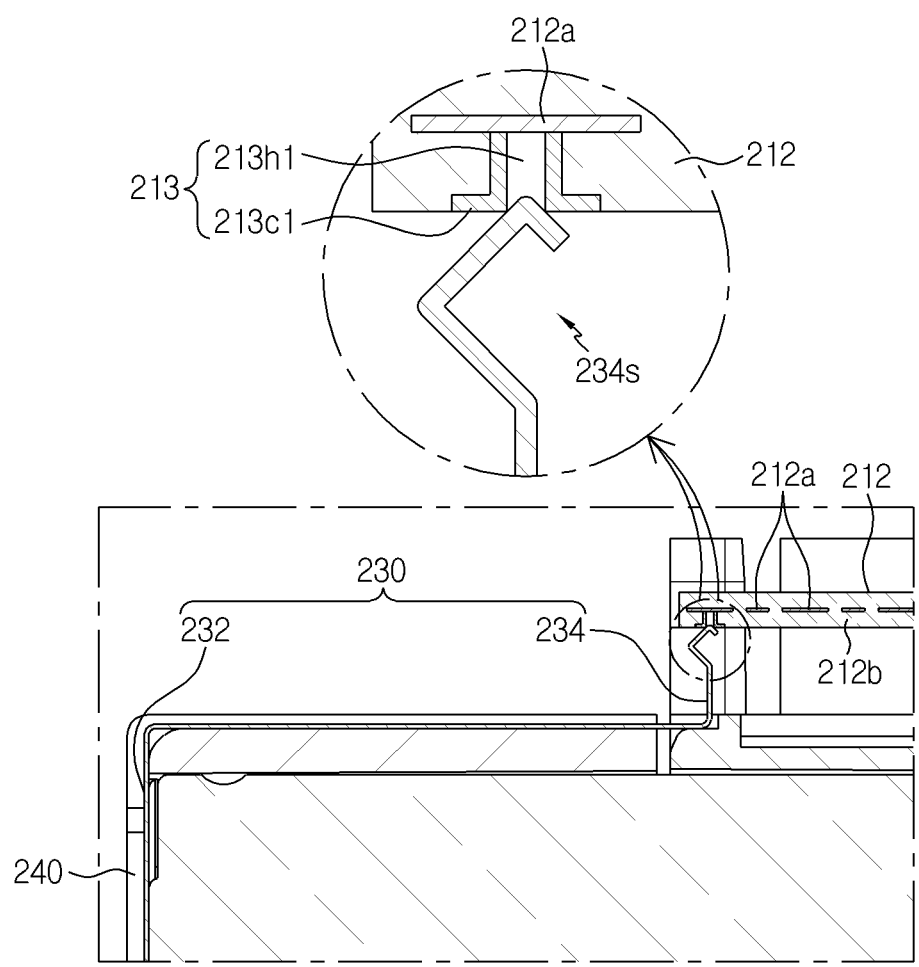
FIG. 4 is a partial sectioned view schematically showing the battery module, taken along the line C-C' of FIG. 3.

Referring to FIGS. 3 and 4 along with FIG. 2, the battery management unit 220 may include a printed circuit board 212. Further, the printed circuit board 212 may be configured to control the charging and discharging of the battery by turning on/off a switch element (not shown) according to the charging or discharging state of the cell assembly 210.

In addition, the printed circuit board 212 may include a plurality of insulating layers (not shown) and a plurality of conductive material layers (not shown) interposed between the plurality of insulation layers. Also, the printed circuit board 212 may have a printed circuit 212a made of a conductive material layer.

In addition, the printed circuit board 212 may have a connecting portion 213 configured to be electrically connected to the printed circuit 212a. Moreover, the connecting portion 213 may have a connecting groove 213h1 formed so that a part of the outer surface of the printed circuit board 212 is dented inward. Further, the connecting groove 213h1 may be formed so that a part of the insulation layer 212b of the printed circuit board 212 is dug inward. In addition, the connecting groove 213h1 may be dug inward so that a part of the printed circuit 212a may be exposed out of the insulation layer 212b.

Further, inner and outer peripheries of the connecting groove 213h1 may be coated with the connecting conductor 213c1 so as to be electrically connected to the printed circuit 212a. In this case, the connecting conductor 213c1 may include at least one selected from the group consisting of silver, gold, copper and aluminum with excellent electrical conductivity.

In addition, the battery management unit 220 may include an external input/output terminal 222 (FIG. 1) configured to receive a power from an external device or to supply a power. The external input/output terminal 222 may include at least one selected from the group consisting of silver, gold, copper and aluminum with excellent electrical conductivity. The external input/output terminal 222 may have a clip-type connecting terminal.

In addition, referring to FIGS. 3 and 4 again along with FIG. 2, the bus bar plate 230 may be configured to contact the electrode terminals 111 of the plurality of cylindrical battery cells 100 to electrically connect the plurality of cylindrical battery cells 100 to each other.

Specifically, the bus bar plate 230 may have a plate shape. In addition, the bus bar plate 230 may include an electrically conductive metal material. Further, the bus bar plate 230 may have a connection portion 232 and a sensing portion 234. Also, the connection portion 232 may be configured to electrically connect the plurality of secondary batteries 100 to each other.

Further, a part of the connection portion 232 may contact the first electrode terminal 111A of one cylindrical battery cell 100 and the other part of the connection portion 232 may contact the second electrode terminal 111B of another cylindrical battery cell 100, so that the first electrode terminal 111A of one cylindrical battery cell 100 and the second electrode terminal 111B of another cylindrical battery cell 100 are electrically connected.

For example, as shown in FIG. 2, the connection portion 232 may have a shape extending in the vertical direction and/or the left and right direction. More specifically, one 230b of the bus bar plates 230 may have a strip shape where the connection portion 232 extends in a rectangular form. In addition, one 230c of the six bus bar plates 230 may have a plate shape where the connection portion 232 extends in the vertical direction.

Further, the connection portions 232 of the four bus bar plates 230a may have a part extending in the vertical direction and a part extending in the left and right direction. In addition, the six bus bar plates 230 may be electrically connected to the positive electrode terminals 111A and the negative electrode terminals 111B of the plurality of cylindrical battery cells 100.

Moreover, the sensing portion 234 of the bus bar plate 230 may be formed to extend from one side end of the connection portion 232 in contact with the electrode terminal 111 in order to transfer a power to an external electronic device (not shown) or sense a voltage of the cylindrical battery cell 100. That is, the sensing portion 234 may be connected to the connecting portion 213 of the printed circuit board 212 having the external input/output terminal 222 in order to transfer a power to the outside.

Specifically, the sensing portion 234 may have a strip form elongated from one end of the connection portion 232. In addition, the sensing portion 234 may have a bent structure 234s where an elongated longitudinal end of the sensing portion 234 is bent at least two times. For example, as shown in FIG. 2, the sensing portion 234 may have a bent structure 234s where the elongated longitudinal end of the sensing portion 234 is bent two times in the outer direction and bent two times in the inner direction.

Moreover, the sensing portion 234 may be located such that at least a part of the bent structure 234s is in elastic contact with the connecting portion 213. In this case, the bent structure 234s may be located to be electrically connected to the connecting conductor 213c1 coated on the connecting groove 213h1 of the connecting portion 213.

For example, as shown in FIG. 4, an upper part of the bent structure 234s of the sensing portion 234 may be located to fit into the connecting groove 213h1. In this case, the bent structure 234s of the sensing portion 234 may have a bent shape to have a sharp shape in the upper direction.

Thus, according to this configuration of the present disclosure, since at least a part of the bent structure 234s of the sensing portion 234 is located to be in contact with the inside of the connecting portion 213, a part of the sensing portion 234 may keep elastically connected to the connecting conductor 213c1 coated on the connecting portion 213 by using the elastic force of the bent structure 234s of the sensing portion 234. Accordingly, in the present disclosure, unlike the prior art, the process of soldering the sensing portion 234 of the bus bar plate 230 to be bonded to the connecting portion 213 of the printed circuit board 212 may be excluded, thereby reducing the manufacturing time and reducing the manufacturing costs.

Figure 5:
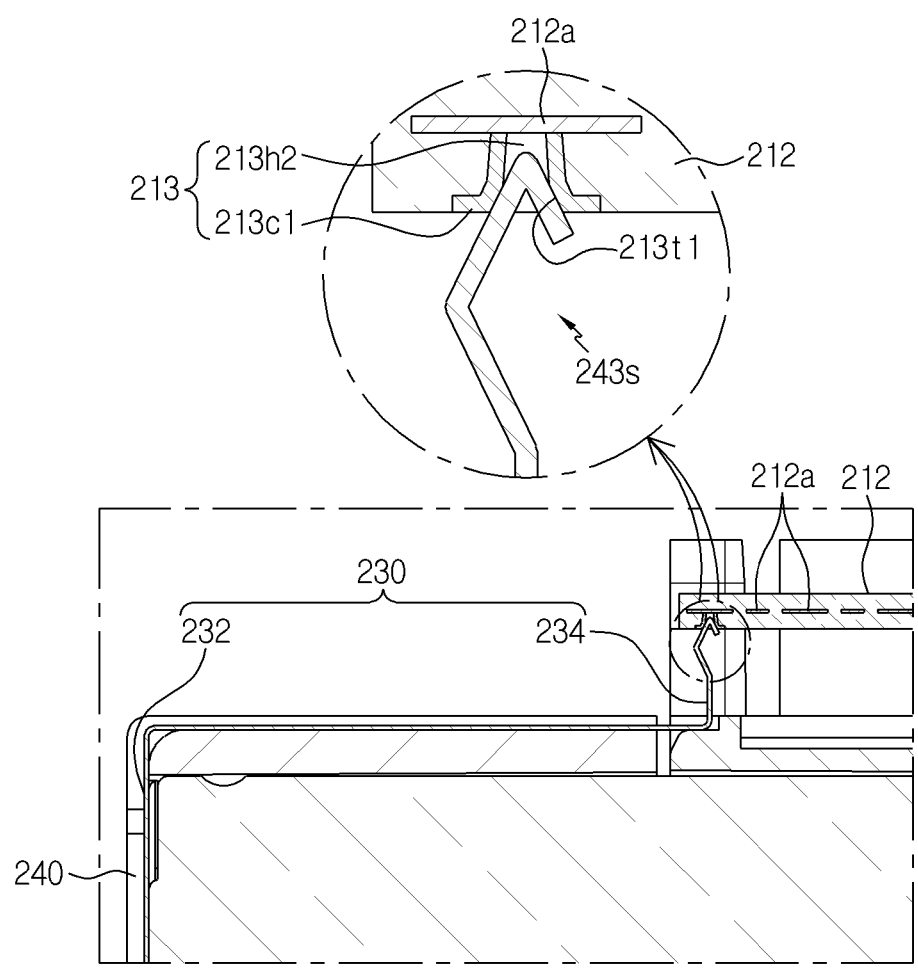
FIG. 5 is a partial sectioned view schematically showing a battery module according to another embodiment of the present disclosure.

FIG. 5 is a partial sectioned view schematically showing a battery module according to another embodiment of the present disclosure.

Referring to FIG. 5, the printed circuit board 212 of FIG. 5 may have a tapered structure 213t1 formed inside the connecting groove 213h2 of the connecting portion 213, unlike the printed circuit board of FIG. 4. Specifically, the tapered structure 213t1 may be shaped such that an inner width of the connecting groove 213h2 gradually decreases upward from a lower end thereof. In addition, at least a part of the bent structure 234s of the sensing portion 234 may be inserted and connected upward from the lower end of the connecting portion 213.

For example, referring to FIG. 5, the tapered structure 213t1 may be formed at a lower portion of the inner surface of the connecting groove 213h2. In this case, the tapered structure 213t1 may be shaped such that the inner width of the connecting groove 213h2 gradually decreases upward from the lower end thereof. Further, the inner surface of the tapered structure 213t1 may be coated with the connecting conductor 213c1 connected to the printed circuit 212a. In addition, the upper part of the bent structure 234s of the sensing portion 234 may be located to contact the inner surface of the tapered structure 213t1.

Thus, according to this configuration of the present disclosure, since the tapered structure 213t1 is formed at the lower part of the inner surface of the connecting groove 213h2, the bent structure 234s of the sensing portion 234 may have a wider contact surface with the coated connecting conductor 213c1 of the connecting groove 213h2. In addition, since the bent structure 234s of the sensing portion 234 is inserted and connected into the tapered structure 213t1 shaped corresponding to at least a part of the bent structure 234s, the bent structure 234s may appropriately maintain the shape in close contact with the bent structure 234s of the sensing portion 234.

Figure 6:
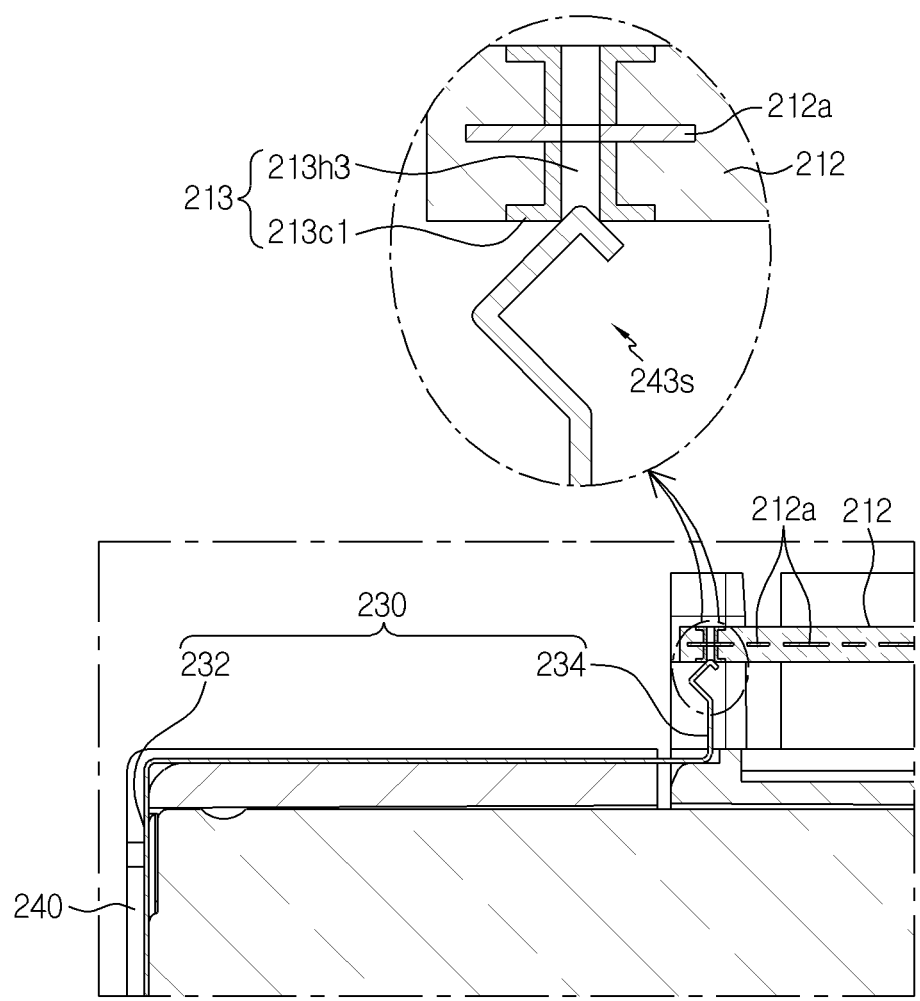
FIG. 6 is a partial sectioned view schematically showing a battery module according to still another embodiment of the present disclosure.

FIG. 6 is a partial sectioned view schematically showing a battery module according to still another embodiment of the present disclosure.

Referring to FIG. 6, the connecting portion 213 of the printed circuit board 212 of the present disclosure may have a connecting hole 213h3 so that a part of the printed circuit board 212 is perforated. That is, unlike the printed circuit board having the connecting hole 213h1 as shown in FIG. 4, a connecting hole 213h3 perforated from the upper surface of the printed circuit board 212 to the lower surface thereof may be formed at a part of the printed circuit board 212 of FIG. 6. In addition, the connecting conductor 213c1 may be coated on the inner and outer peripheries of the connecting hole 213h3 so as to be electrically connected to the printed circuit 212a. In this case, the connecting conductor 213c1 may include at least one selected from the group consisting of silver, gold, copper and aluminum with excellent electrical conductivity.

Thus, the sensing portion 234 of the bus bar plate 230 may be inserted and connected into the connecting hole 213h3 of the connecting portion 213 of the printed circuit board 212 from the top to the bottom. Also, similarly, the sensing portion 234 of the bus bar plate 230 may be inserted and connected into the connecting hole 213h3 of the printed circuit board 212 from the bottom to the top. Accordingly, the printed circuit board 212 may diversify the positions of the sensing portion 234 of the bus bar plate 230, thereby implementing the battery module 200 in various types.

Figure 7:
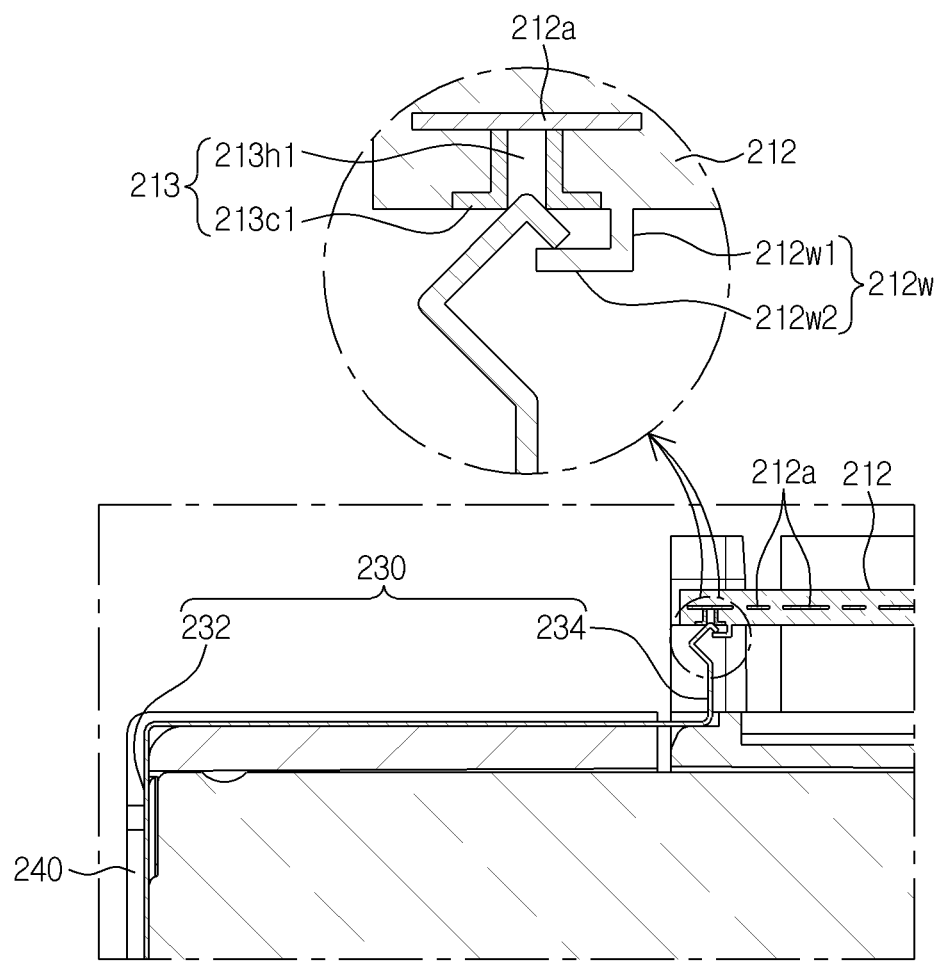
FIG. 7 is a partial sectioned view schematically showing a battery module according to still another embodiment of the present disclosure.

FIG. 7 is a partial sectioned view schematically showing a battery module according to still another embodiment of the present disclosure.

Referring to FIG. 7, unlike the printed circuit board of FIG. 4, the printed circuit board 212 of FIG. 7 may have a support wall 212w formed at an upper surface or a lower surface thereof to protrusively extend outward. Specifically, the support wall 212w may protrusively extend outward to support the extended longitudinal terminal of the sensing portion 234.

More specifically, the support wall 212w may have a body portion 212w1 extending in the lower direction from the bottom surface of the printed circuit board 212, and a support portion 212w2 extending in the horizontal direction from the body portion 212w1. Here, the body portion 212w1 may be configured to support the extended longitudinal terminal of the sensing portion 234 in the horizontal direction. In addition, the support portion 212w2 may be configured to support the terminal of the sensing portion 234 in the upper direction.

For example, as shown in FIG. 7, the support wall 212w having an "L" shape as a whole may be formed at the bottom surface of the printed circuit board 212. Further, the support wall 212w may include a body portion 212w1 extending in the lower direction from the bottom surface of the printed circuit board 212, and a support portion 212w2 extending in the horizontal direction from the body portion.

Thus, according to this configuration of the present disclosure, since the support wall 212w protrusively extending outward is provided on the upper surface or the lower surface of the printed circuit board 212, the extended longitudinal terminal of the sensing portion 234 may be supported in the vertical direction (Z-direction in FIG. 2) and in the horizontal direction (Y-direction in FIG. 2). Accordingly, the sensing portion 234 may be prevented from moving due to an external impact, thereby stably maintaining the connecting state between the sensing portion 234 and the connecting portion 213.

Figure 8:
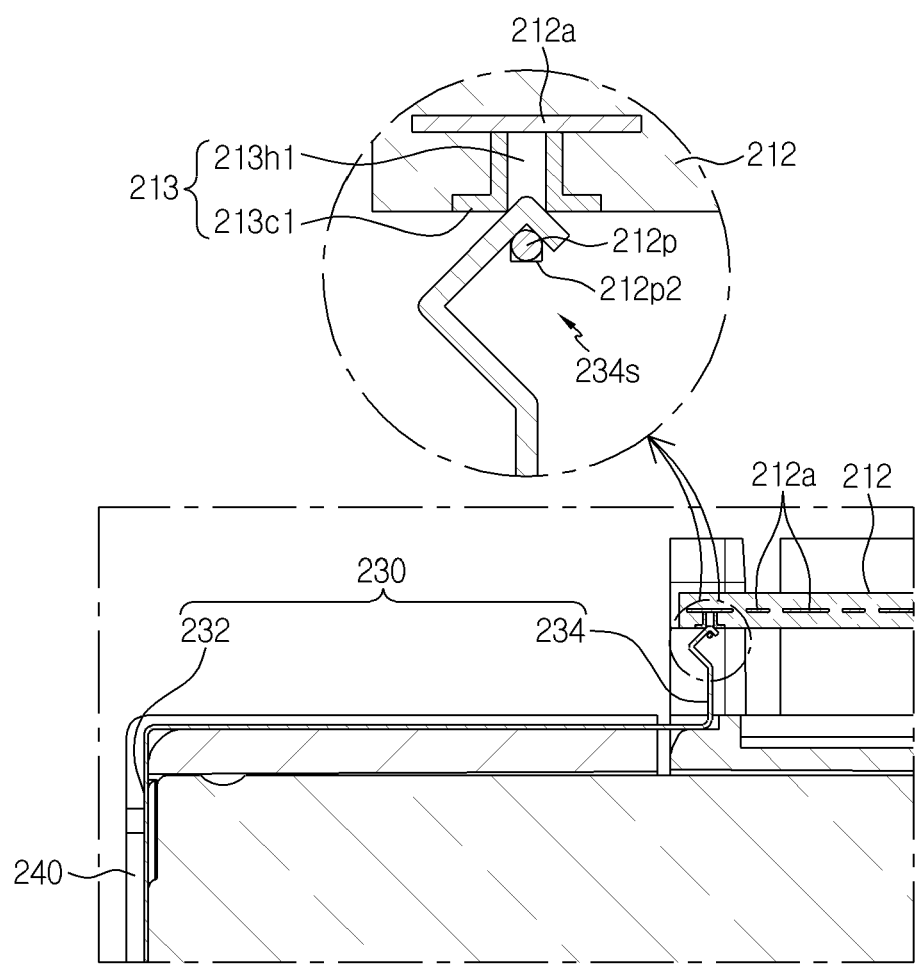
FIG. 8 is a partial sectioned view schematically showing a battery module according to still another embodiment of the present disclosure.

FIG. 8 is a partial sectioned view schematically showing a battery module according to still another embodiment of the present disclosure.

Referring to FIG. 8, the printed circuit board 212 of FIG. 8 may have a hanging rod 212p formed at the connecting groove 213h1 to extend in the horizontal direction (X-direction in FIG. 2), unlike the printed circuit board of FIG. 4. Specifically, the hanging rod 212p may be located such that at least a part of the bent structure 234s of the sensing portion 234 is hung thereon.

For example, as shown in FIG. 8, the bent structures 234s of the sensing portion 234 may be bent one time in the outer direction (the front direction) and bent two times in the inner direction (the rear direction). In addition, the printed circuit board 212 may have a support 212p2 protruding downward from a lower surface of the periphery of the connecting groove 213h1. Moreover, the printed circuit board 212 may have a hanging rod 212p elongated in the horizontal direction (X-direction in FIG. 2) from the support 212p2. Also, the bent portion at the top of the bent structure 234s of the sensing portion 234 may be located to be hung on the hanging rod 212p.

Thus, according to this configuration of the present disclosure, since the hanging rod 212p extending in the horizontal direction is formed at the connecting groove 213h1 such that at least a part of the bent structure 234s of the sensing portion 234 is hung thereon, the connecting state between the bent structure 234s and the connecting conductor 213c1 formed at the connecting groove 213h1 may be stably maintained.

Figure 9:
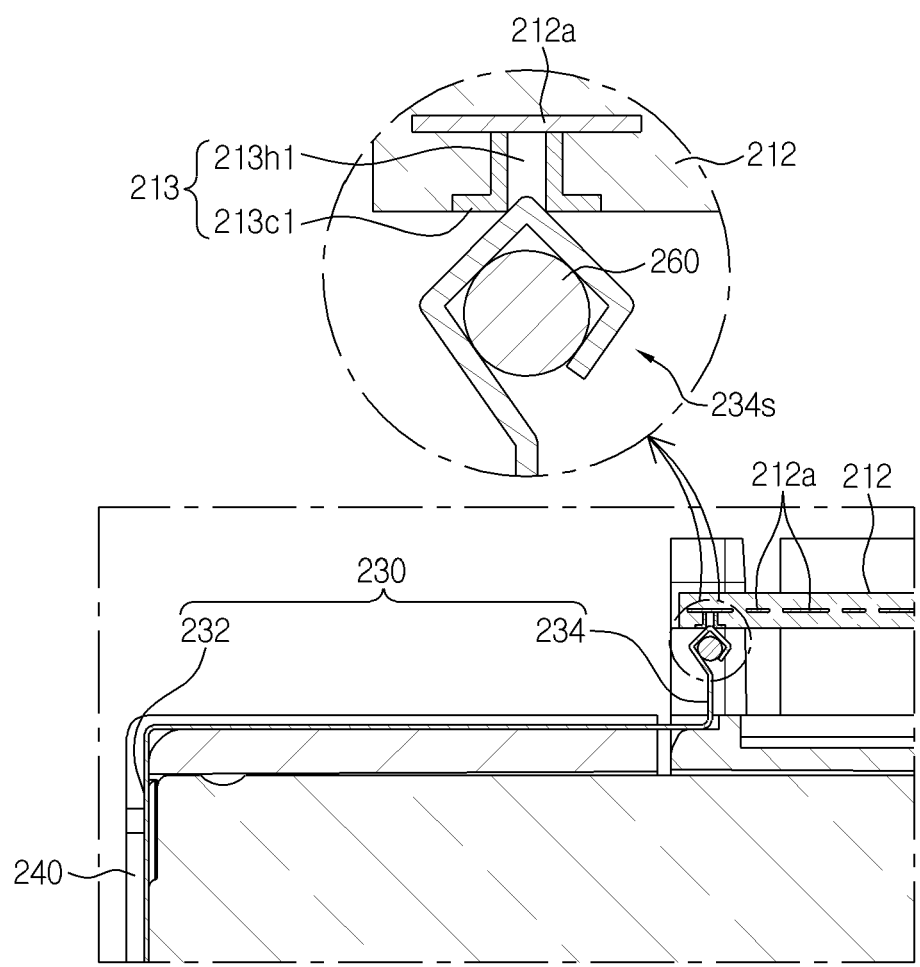
FIG. 9 is a partial sectioned view schematically showing a battery module according to still another embodiment of the present disclosure.

FIG. 9 is a partial sectioned view schematically showing a battery module according to still another embodiment of the present disclosure.

Referring to FIG. 9, the printed circuit board 212 of FIG. 9 may have an elastic member 260 provided at the inner side of the bent structure 234s of the sensing portion 234, unlike the printed circuit board FIG. 4. Specifically, the elastic member 260 may have a predetermined size to support the bent structure 234s of the sensing portion 234 in the outer direction. In addition, the elastic member 260 may be, for example, a lightweight material such as a flame retardant sponge or a flame retardant Styrofoam. Alternatively, the elastic member 260 may have a ball shape made of a plastic skeleton.

For example, as shown in FIG. 9, the bent structures 234s of the sensing portion 234 may be bent one time in the outer direction and bent two times in the inner direction. In addition, the elastic member 260 may be located inside the bent structure 234s. Further, the elastic member 260 may have a predetermined size capable of supporting the bent structure 234s in the outer direction so that the shape of the bent structure 234s of the sensing portion 234 is maintained.

Thus, according to this configuration of the present disclosure, since the elastic member 260 configured to support the bent structure 234s of the sensing portion 234 in the outer direction is provided to the inner side of the bent structure 234s of the sensing portion 234, it is possible to prevent that the bent structure 234s of the sensing portion 234 is deformed to release the contact state with the connecting conductor 213c1 of the connecting portion 213. Accordingly, the durability of the battery module 200 may be further improved.

Figure 10:
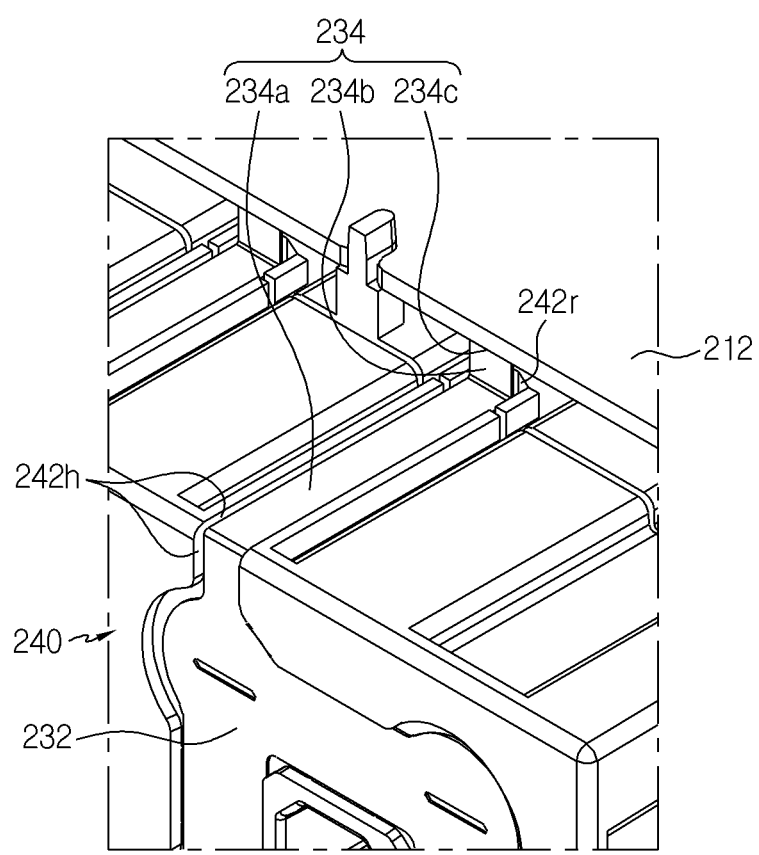
FIG. 10 is a partial enlarged view schematically showing a battery module according to still another embodiment of the present disclosure.

FIG. 10 is a partial enlarged view schematically showing a battery module according to still another embodiment of the present disclosure.

Referring to FIG. 10 along with FIGS. 1 and 2, the battery module 200 of the present disclosure may further include a module housing 240 having an inner space for accommodating the cell assembly 210.

Specifically, the module housing 240 may include an electrically insulating material. For example, the module housing 240 may include a plastic material such as polyvinyl chloride (PVC). In addition, the module housing 240 may include a first case 241 and a second case 242. Also, a plurality of hollow structures H1 may be formed at the first case 241 and the second case 242 to surround the outer surface of the upper portion or the lower portion of the cylindrical battery cells 100 so that the plurality of cylindrical battery cells 100 are accommodated.

Moreover, the first case 241 and the second case 242 may have a bolt fastening structure. For example, as shown in FIG. 2, fastening holes S1 may be formed in the first case 241 and the second case 242 so that four bolts 252 are inserted therein. In addition, as the four bolts 252 may be fastened to the fastening holes S1 of the first case 241 and the second case 242, a rear part of the first case 241 and a front part of the second case 242 may be coupled to each other.

In addition, an insert groove 242h is formed at the outer surfaces of the first case 241 and the second case 242 of the module housing 240 so that the connection portion 232 of the bus bar plate 230 and at least a part of the sensing portion 234 may be inserted and fixed therein.

Specifically, the insert groove 242h formed at the outer surface of the module housing 240 may have an inner surface with a size corresponding to the outer shape of the bus bar plate 230. For example, as shown in FIG. 2, an insert groove 242h may be formed at the front outer surface of the first case 241 so that the connection portion 232 of the bus bar plate 230 may be inserted and included therein.

In addition, an insert groove 242h may be formed at the upper outer surface of the first case 241 so that a part of the sensing portion 234 of the bus bar plate 230 may be inserted and fixed therein. Similarly, an insert groove 242h may be formed at the rear outer surface and the upper outer surface of the second case 242 of the module housing 240 so that a part of the connection portion 232 and a part of the sensing portion 234 of the bus bar plate 230 may be inserted and fixed therein.

Thus, according to this configuration of the present disclosure, since the insert groove 242h is formed at the outer surface of the module housing 240 so that the connection portion 232 and the sensing portion 234 of the bus bar plate 230 may be partially inserted and fixed therein, the bus bar plate 230 may establish a stable electrical connection between the cell assemblies 210 and also prevent the bus bar plate 230 from being damaged due to foreign matter. In addition, since the sensing portion 234 of the bus bar plate 230 may be prevented from moving due to an external shock, it is possible to stably maintain the electrical connection between the battery management unit 220 and the cell assembly 210. Accordingly, the durability of the battery module 200 may be improved.

Meanwhile, referring to FIG. 10 again along with FIGS. 1, 2 and 4, the printed circuit board 212 may be mounted on the module housing 240. Also, a fixing protrusion P1 may be formed on the second case 242 of the module housing 240 so that the printed circuit board 212 is mounted and fixed thereon.

In addition, the sensing portion 234 may include a fixed part 234a, an upright part 234b, and a connecting part 234c. Specifically, the fixed part 234a may be a part that is inserted into the insert groove 242h formed at the horizontal outer surface of the module housing 240. Further, the upright part 234b may be a part that is bent upward from the end of the fixed part 234a extending in the longitudinal direction to protrude outward.

In addition, the connecting part 234c may have a bent structure 234s that is connected to an end of the upright part 234b extending in the longitudinal direction and bent at least two times in the inner direction, or in the outer direction, or in the inner direction and the outer direction. Further, the connecting part 234c may be located such that a top portion of the bent structure 234s is in pressure contact with the connecting portion 213.

For example, as shown in FIG. 10, the sensing portions 234 of three bus bar plates 230 may be divided into a fixed part 234a inserted and fixed into the insert groove 242h of the module housing 240, an upright part 234b bent from one end of the fixed part 234a and extending upward, and a connecting part 234c where the top portion of the connecting structure is contacted and connected to the connecting portion 213.

Thus, according to this configuration of the present disclosure, the since sensing portion 234 of the present disclosure includes the fixed part 234a inserted and fixed into the module housing 240, the upright part 234b extending upward to contact the connecting portion 213 of the printed circuit board 212 and the connecting part 234c contacted and connected to the connecting portion 213, it is optimized to make the stable connection state with the printed circuit board 212 mounted on the module housing 240.

Meanwhile, referring to FIG. 10 again, the module housing 240 may have a support rib 242r protruding in the upper direction. Specifically, the support rib 242r may have a support surface to support the upright part 234b outward. That is, the support rib 242r may be formed to protrude upward to contact the inner surface of the upright part 234b of the sensing portion 234 so that the inner surface of the upright part 234b of the sensing portion 234 is supported in the outer direction.

For example, as shown in FIG. 10, the support rib 242r protruding upward may be formed at the periphery of the insert groove 242h formed at the upper surface of the module housing 240. In this case, the support rib 242r may support a part of the inner surface of the upright part 234b of the sensing portion 234 in the outer direction.

Thus, according to this configuration of the present disclosure, since the support rib 242r protruding upward is formed at the module housing 240 to support the upright part 234b in the outward direction, it is possible to prevent the upright part 234b of the sensing portion 234 from being deformed due to an external shock, and it is possible to stably maintain the form in which the upright part 234b extends in the upper direction, thereby stably maintaining the connecting state between the connecting portion 213 of the printed circuit board 212 and the sensing portion 234.

In addition, a battery pack (not shown) according to the present disclosure may include at least two of the battery modules 200. Specifically, the at least two battery modules 200 may be arranged in one direction. In some cases, the battery pack may further include a heatsink (not shown) for heat dissipation.

Also, an electronic device (not shown) according to the present disclosure may include the battery pack. For example, the battery pack may be accommodated in an external case of the electronic device. In addition, the electronic device may be a mobile means such as an electric bicycle.

Meanwhile, even though the terms indicating directions such as upper, lower, left, right, front and rear directions are used in the specification, it is obvious to those skilled in the art that these merely represent relative positions for convenience in explanation and may vary based on a position of an observer or an object.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

100: secondary battery (cylindrical battery cell)
200: battery module
210: cell assembly
212: printed circuit board
212a: printed circuit
212p: hanging rod
212w: support wall
213: connecting portion
213c1: connecting conductor
213h1: connecting groove
213h3: connecting hole
213t1: tapered structure
220: battery management unit
230: bus bar plate
232: connection portion
234: sensing portion
234a: fixed part
234b: upright part
234c: connecting part
234s: bent structure 240: module housing
241, 242: first case, second case
242h: insert groove
242r: support rib
260: elastic member

INDUSTRIAL APPLICABILITY

The present disclosure relates to a battery module. In addition, the present disclosure may be used in industries related to a battery pack equipped with the battery module and an electronic device powered by a secondary battery.

What is claimed is:

1. A battery module, comprising:
a cell assembly having a plurality of secondary batteries;
a battery management unit having a printed circuit board with a printed circuit, the printed circuit board having a connecting portion on an inner section and an outer section, the outer section located at peripheries of the connecting portion, the connecting portion having a connecting conductor that is coated on the inner section and the outer section to be electrically connected to the printed circuit; and
a bus bar plate having a plate shape, the bus bar plate having a connection portion and a sensing portion, the bus bar plate being configured to electrically connect the plurality of secondary batteries and the sensing portion having a strip form elongated from one side end of the connection portion, the sensing portion further having a bent structure where a longitudinal end thereof is bent at least two times, at least a part of the bent structure being in elastic contact with an inside of the connecting portion,
wherein the inner section of the connecting portion includes at least two side walls that are coated with the connecting conductor and face each other across a hallow formed by a connecting groove,
wherein at least the part of the bent structure simultaneously contacts the connecting conductor at the at least two side walls, respectively, and
wherein an inner side of the bent structure is wider than an inner width of the connecting groove when the bent structure is in elastic contact with the inside of the connecting portion.

2. The battery module according to claim 1, wherein a part of the printed circuit board is dented inward in the connecting groove.

3. The battery module according to claim 2, wherein the connecting groove has a tapered structure so that the inner width of the connecting groove gradually decreases upward from a lower end thereof, and
wherein at least the part of the bent structure of the sensing portion is inserted and connected upward from the lower end of the connecting portion.

4. The battery module according to claim 2, wherein a hanging rod extending in a horizontal direction is formed at the connecting groove so that at least the part of the bent structure of the sensing portion is hung thereon.

5. The battery module according to claim 1, wherein the connecting portion further has a connecting hole formed so that a part of the printed circuit board is perforated.

6. The battery module according to claim 1, wherein a support wall protruding outward is formed at the printed circuit board to support an extended longitudinal terminal of the sensing portion.

7. The battery module according to claim 1, wherein an elastic member is provided to the inner side of the bent structure of the sensing portion to support the bent structure of the sensing portion outward.

8. The battery module according to claim 1, further comprising:
a module housing having an inner space formed therein to accommodate the cell assembly,
wherein an insert groove dented inward is formed at an outer surface of the module housing so that a part of the sensing portion extending from the connection portion is inserted and fixed therein.

9. The battery module according to claim 8, wherein the printed circuit board is mounted on the module housing, and
wherein the sensing portion includes:
a fixed part inserted into the insert groove formed at the outer surface of the module housing;
an upright part bent upward from an extended longitudinal end of the fixed part to protrude outward; and
a connecting part connected to an extended longitudinal end of the upright part and having a bent structure that is bent at least two time in an inner direction, or in an outer direction, or in the inner direction and the outer direction, the bent structure of the connecting part having a top portion that is in pressure contact with the connecting portion.

10. The battery module according to claim 9, wherein a support rib protruding upward is formed at the module housing to support the upright part outward.

11. A battery pack, comprising at least one battery module according to claim 1.

12. An electronic device, comprising the battery pack according to claim 11.

13. The battery module according to claim 1, wherein at least the part of the bent structure has a vertex that is inserted into the connecting groove, and locations on opposite sides of the vertex simultaneously contacts the connecting conductor at the at least two side walls.

14. A battery module, comprising:
a cell assembly having a plurality of secondary batteries;
a battery management unit having a printed circuit board with a printed circuit, the printed circuit board having a connecting portion on an inner section and an outer section, the outer section located at peripheries of the connecting portion, the connecting portion having a connecting conductor that is coated on the inner section and the outer section to be electrically connected to the printed circuit; and
a bus bar plate having a plate shape, the bus bar plate having a connection portion and a sensing portion, the bus bar plate being configured to electrically connect the plurality of secondary batteries and the sensing portion having a strip form elongated from one side end of the connection portion, the sensing portion further having a bent structure where a longitudinal end thereof is bent at least two times, at least a part of the bent structure being in elastic contact with an inside of the connecting portion,
wherein the inner section of the connecting portion includes at least two side walls that are coated with the connecting conductor and face each other across a hallow formed by a connecting groove,
wherein at least the part of the bent structure simultaneously contacts the connecting conductor at the at least two side walls, respectively, and
wherein a hanging rod extending in a horizontal direction is formed at the connecting groove so that at least the part of the bent structure of the sensing portion is hung thereon.

15. A battery module, comprising:

a cell assembly having a plurality of secondary batteries;

a battery management unit having a printed circuit board with a printed circuit, the printed circuit board having a connecting portion on an inner section and an outer section, the outer section located at peripheries of the connecting portion, the connecting portion having a connecting conductor that is coated on the inner section and the outer section to be electrically connected to the printed circuit; and a bus bar plate having a plate shape, the bus bar plate having a connection portion and a sensing portion, the bus bar plate being configured to electrically connect the plurality of secondary batteries and the sensing portion having a strip form elongated from one side end of the connection portion, the sensing portion further having a bent structure where a longitudinal end thereof is bent at least two times, at least a part of the bent structure being in elastic contact with an inside of the connecting portion, wherein the inner section of the connecting portion includes at least two side walls that are coated with the connecting conductor and face each other across a hallow formed by a connecting groove, wherein at least the part of the bent structure simultaneously contacts the connecting conductor at the at least two side walls, respectively, and wherein a support wall protruding outward is formed at the printed circuit board to support an extended longitudinal terminal of the sensing portion.

* * * * *